United States Patent
King et al.

(10) Patent No.: US 6,465,275 B2
(45) Date of Patent: *Oct. 15, 2002

(54) METHOD OF FORMING A STACK OF PACKAGED MEMORY DIE AND RESULTING APPARATUS

(75) Inventors: Jerrold L. King, Boise; Jerry M. Brooks, Caldwell, both of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/923,481

(22) Filed: Aug. 6, 2001

(65) Prior Publication Data

US 2001/0049157 A1 Dec. 6, 2001

Related U.S. Application Data

(63) Continuation of application No. 09/641,574, filed on Aug. 18, 2000, now Pat. No. 6,329,221, which is a continuation of application No. 09/036,662, filed on Mar. 9, 1998, now Pat. No. 6,207,474.

(51) Int. Cl.⁷ .............................................. H01L 21/44
(52) U.S. Cl. ........................ 438/107; 438/108; 438/109
(58) Field of Search ................................ 438/106, 107, 438/108, 109, 110, 111, 112; 257/723, 724, 725, 726

(56) References Cited

U.S. PATENT DOCUMENTS

| | | |
|---|---|---|
| 4,992,849 A | 2/1991 | Corbett et al. |
| 4,992,850 A | 2/1991 | Corbett et al. |
| 4,996,587 A | 2/1991 | Hinrichsmeyer et al. |
| 5,107,328 A | 4/1992 | Kinsman |
| 5,137,836 A | 8/1992 | Lam |
| 5,155,067 A | 10/1992 | Wood et al. |
| 5,239,198 A | 8/1993 | Lin et al. |
| 5,239,747 A | 8/1993 | Ewers |
| 5,255,156 A | 10/1993 | Chang |
| 5,323,060 A | 6/1994 | Fogal et al. |
| 5,343,075 A | 8/1994 | Nishino |
| 5,378,981 A | 1/1995 | Higgins, III |
| 5,418,687 A | 5/1995 | Chen |
| 5,420,751 A | 5/1995 | Burns |
| 5,424,652 A | 6/1995 | Hembree et al. |
| 5,448,165 A | 9/1995 | Hodge et al. |
| 5,461,544 A | 10/1995 | Ewers |
| 5,465,470 A | 11/1995 | Vongfuangfoo et al. |
| 5,468,655 A | 11/1995 | Greer |
| 5,475,317 A | 12/1995 | Smith |
| 5,477,082 A | 12/1995 | Buckley, III et al. |
| 5,480,840 A | 1/1996 | Barnes et al. |
| 5,484,959 A | 1/1996 | Burns |
| 5,495,398 A | 2/1996 | Takiar et al. |
| 5,514,907 A | 5/1996 | Moshayedi |
| 5,535,101 A | 7/1996 | Miles et al. |
| 5,592,019 A | 1/1997 | Ueda et al. |
| 5,600,183 A | 2/1997 | Gates, Jr. |
| 5,602,420 A | 2/1997 | Ogata et al. |
| 5,604,377 A | 2/1997 | Palagonia |
| 5,637,912 A | 6/1997 | Cockerill et al. |
| 5,661,087 A | 8/1997 | Pedersen et al. |
| 5,677,569 A | 10/1997 | Choi et al. |
| 5,790,380 A | 8/1998 | Frankeny |
| 5,863,813 A | 1/1999 | Dando |
| 5,933,712 A | 8/1999 | Bernhardt et al. |
| 5,940,277 A | 8/1999 | Farnworth et al. |
| 5,943,213 A | 8/1999 | Sasov |
| 5,986,886 A | 11/1999 | Sasov |
| 6,049,123 A | 4/2000 | Burns |
| 6,087,718 A | 7/2000 | Cho |
| 6,153,929 A | 11/2000 | Moden et al. |
| 6,207,474 B1 * | 3/2001 | King et al. ................ 438/107 |

\* cited by examiner

Primary Examiner—Kevin M. Picardat
(74) Attorney, Agent, or Firm—TraskBritt (57) ABSTRACT

A stacked assembly of integrated circuit semiconductor devices includes a stack of integrated circuit semiconductor devices supported by a printed circuit board (PCB). One or more multi-conductor insulating assemblies provide an interface between terminals of the integrated circuit semiconductor devices and external circuitry.

13 Claims, 10 Drawing Sheets

METHOD OF FORMING A STACK OF PACKAGED MEMORY DIE AND RESULTING APPARATUS

CROSS REFERENCE TO RELATED APPLICATIONS

This application is a continuation of application Ser. No. 09/641,574, filed Aug. 18, 2000, now U.S. Pat. No. 6,329,221 which is a continuation of application Ser. No. 09/036,662, filed Mar. 9, 1998, now U.S. Pat. No. 6,207,474 B1, issued Mar. 27, 2001.

BACKGROUND OF THE INVENTION

1. Field of the Invention

The invention relates to packaged integrated circuit devices. More specifically, the present invention relates to an interconnected stack of packaged memory devices and the method of forming a stack of interconnected packaged memory devices.

2. State of the Art

High performance, low cost, increased miniaturization of components, and greater packaging density of integrated circuit semiconductor devices (ICs) have long been the goals of the computer industry. Greater integrated circuit semiconductor device package density for a given level of component and internal conductor density is primarily limited by the space available for die mounting and packaging. For lead frame mounted dies, this limitation is, to a great extent, a result of lead frame design.

In a conventional lead frame design, the lead frame includes a plurality of leads having their ends terminating adjacent a side or edge of an integrated circuit semiconductor device supported by the die paddle portion of the lead frame. Electrical connections are made by means of wire bonds extending between the leads of the lead frame and the bond pads located on the active surface of the integrated circuit semiconductor device. Subsequent to the wire bonding operation, portions of the leads of the lead frame and the integrated circuit semiconductor device are encapsulated in suitable plastic material to form a packaged semiconductor device. The leads and lead frame are then trimmed and formed to the desired configuration after the packaging of the semiconductor device in the encapsulant material.

In a Leads-Over-Chip (LOC) type lead frame configuration for an integrated circuit semiconductor (IC) device, the leads of the lead frame extend over the active surface of the semiconductor device being insulated therefrom by tape which is adhesively bonded to the semiconductor device and the leads of the lead frame. Electrical connections are made between the leads of the lead frame and bond pads on the active surface of the semiconductor device by way of wire bonds extending therebetween. After wire bonding, the leads of the LOC lead frame and the semiconductor device are encapsulated in suitable plastic to encapsulate the semiconductor device and portions of the leads. Subsequently, the leads are trimmed and formed to the desired configuration to complete the packaged semiconductor device.

With ever-increasing demands for miniaturization and higher operating speeds, multi-chip module systems (MCMs) have become increasingly attractive in a variety of applications. Generally, MCMs may be designed to include more than one type of semiconductor device within a single package, or may include multiples of the same type of semiconductor device, such as the single-in-line memory module (SIMM) or dual-in-line memory module (DIMM).

MCMs typically comprise a planar printed circuit board (PCB) or other semiconductor carrier substrate to which a plurality of semiconductor devices is attached. Laminated substrates, such as FR-4 boards, are included in the term PCB as used herein, as are ceramic and silicon substrates, although the latter constructions are at this time less common as MCM carrier substrates. The semiconductor devices are typically wire bonded, TAB-connected or flip-chip bonded (by an array of solder or other conductive bumps or conductive epoxies) to the PCB. An MCM configuration typically allows semiconductor devices to be bonded to one side only of the carrier substrate. Moreover, for semiconductor devices that are wire bonded to the PCB, the bond wires extend from the top surface of each semiconductor device mounted on one side of the PCB by its back side to the plane of the PCB surface on that side, requiring longer wires to be used to connect the semiconductor devices to the PCB traces than if the active surface of the semiconductor device were closer to the PCB surface. This often leads to undesirable parasitic electrical characteristics. Also, mounting the semiconductor devices on a substrate to be subsequently mounted on the PCB uses valuable area of the PCB which may be used for other purposes. Additionally, the plurality of wires used to connect the semiconductor devices to the substrate of the MCM affects the speed at which the MCM responds when connected to the PCB.

In many instances, PCBs (such as those used in computers) have fixed size requirements, thereby making space on the PCB scarce. Therefore, a need exists for a high density, minimal volume configuration, and high response rate series of interconnected semiconductor devices for use in conjunction with a PCB.

BRIEF SUMMARY OF THE INVENTION

An integrated circuit semiconductor device stack includes a stack of packaged integrated circuit semiconductor devices (ICs) supported by a board or other support surface. One or more multi-conductor insulating assemblies provide an interface between terminals of the ICs and external circuitry. One embodiment of the multi-conductor insulating assembly includes tape (such as Kapton™ tape) on which conductors are applied. One surface of the tape is preferably adhesive so as to stick to the ICs. When properly aligned, the conductors make contact with the terminals of the ICs and with a multi-conductor port. There may be multiple layers of conductors where different terminals of individual ICs aligned in a stack are to receive different signals. Another embodiment of the multi-conductor insulating assembly includes an epoxy onto which conductors are applied. In yet another embodiment, multi-conductor insulating assembly tape is sandwiched between ICs. Contact pads on the tape are aligned with bonding pads on the ICs. In yet another embodiment of the multi-conductor insulating assembly, multiple conductors are extruded and cut to form the desired multi-conductor assembly which is subsequently adhesively bonded to the ICs with the conductors in contact with the bonding pads on the ICs.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
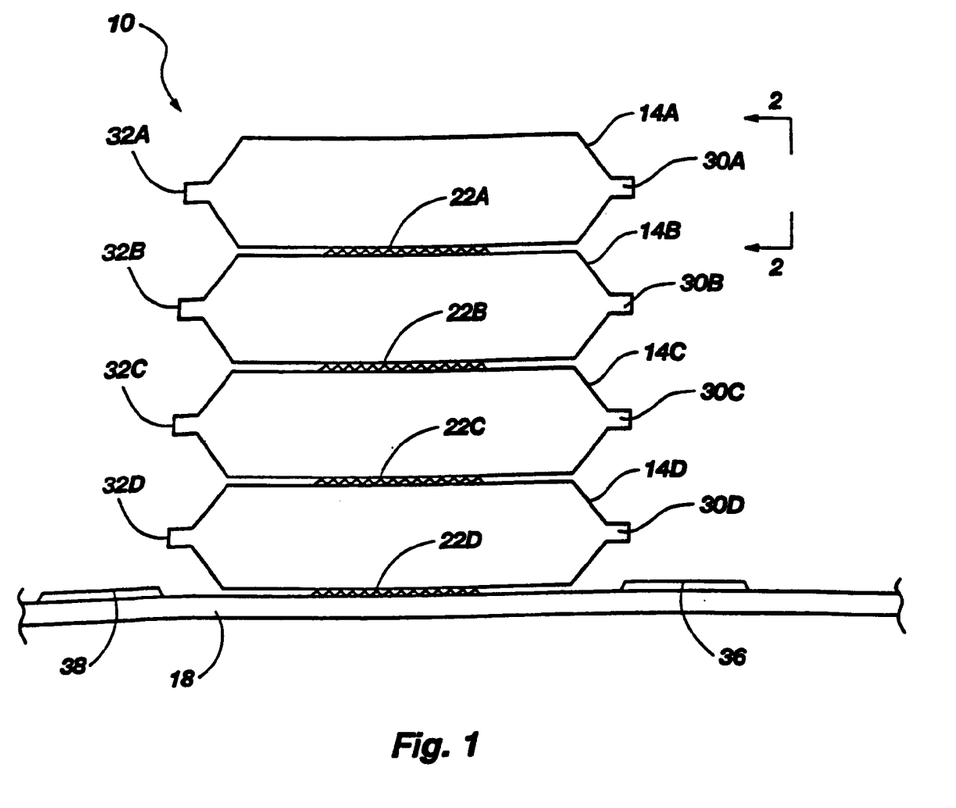
FIG. 1 is a front view of a stack of ICs on a board.

Referring to FIG. 1, an IC device stack assembly 10 includes a stack of integrated circuit semiconductor devices 14A, 14B, 14C, and 14D (collectively referred to as ICs 14) positioned on a board 18. ICs 14 are illustrated as Thin Small-Outline Package (TSOP) devices, but may have another packaging or be unpackaged. ICs 14 may be any of a variety of devices including, but not limited to, dynamic random access memory (DRAM), static random access memory (SRAM), programmable read only memory (PROM), application specific integrated circuits (ASICs), gate arrays, control devices, and microprocessors. Merely as an example, and not a limitation, the invention may be used with a dual-in-line package stack on a dual-in-line board. Board 18 may be any of a variety of boards or supports including, but not limited to, a PCB. Although four integrated circuit semiconductor devices are shown in the IC device stack assembly 10 of ICs, the IC device stack assembly 10 could include a greater or lesser number.

Individual integrated circuit semiconductor devices 14A and 14B may be adhered to each other through adhesive 22A. Accordingly, individual integrated circuit semiconductor devices 14B and 14C may be adhered to each other through adhesive 22B. Similarly, integrated circuit semiconductor devices 14C and 14D may be adhered to each other through adhesive 22C while integrated circuit semiconductor device 14D may be adhered to board 18 through adhesive 22D. Adhesives 22A, 22B, 22C, and 22D (referred to collectively as adhesives 22) may be an adhesively coated tape or a suitable type liquid adhesive. If desired, adhesive 22D may differ from adhesives 22A, 22B, and 22C. Structural members (not shown) other than adhesive may be used to position the ICs 14 with respect to each other, if desired.

ICs 14 include terminals 30A, 30B, 30C, and 30D (collectively terminals 30) and terminals 32A, 32B, 32C, and 32D (collectively terminals 32) to interface with external electrical components. Terminals 30 and 32 are illustrated as cropped lead fingers, but could have a variety of other desired shapes. Multi-conductor ports 36 and 38, described below, are supported by board 18.

Figure 2:
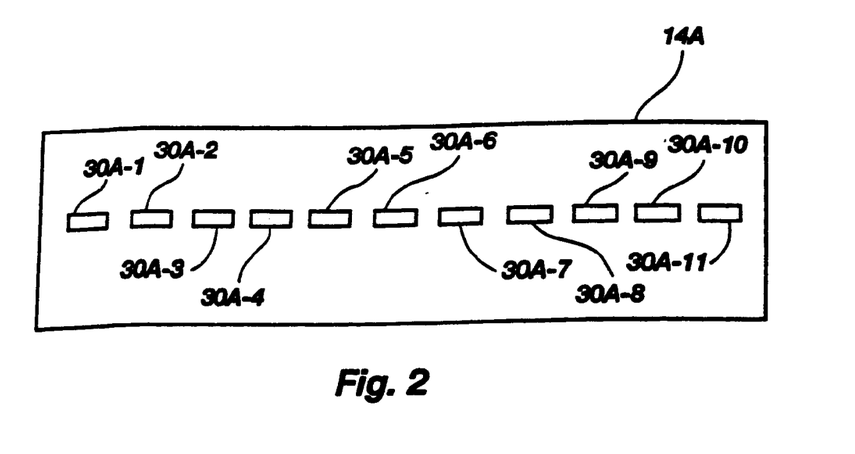
FIG. 2 is a side view of one of the ICs taken along lines 2—2 of FIG. 1.

Referring to FIG. 2, a side view of terminals 30A taken along lines 2—2 of FIG. 1 is representative of side views of terminals 30B, 30C, 30D, and terminals 32A, 32B, 32C, and 32D. Terminals 30A include terminals 30A-1, 30A-2, 30A-3, 30A-4, 30A-5, 30A-6, 30A-7, 30A-8, 30A-9, 30A-10, and 30A-11. Of course, a greater or less number of terminals may be employed in a particular example. Further, terminals may be applied to more than two sides of ICs 14. For example, terminals like terminals 30 and 32 could be applied to all four sides of each individual IC device 14.

To facilitate the interface between ICs 14 and external electrical components, multi-conductor insulating assemblies are connected between terminals 30 and multi-conductor port 36 and between terminals 32 and multi-conductor port 38. The multi-conductor insulating assemblies include multi-conductors, as well as insulating material between to separate conductors. The insulating material may provide a pliable, flexible, yet supportive structure to the conductors. The insulating material may be any of various materials including, but not limited to, tape and epoxy. The tape may be a polyamide resin in the form of a film (such as is marketed by duPont under the name Kapton™). The tape may also be a well known type of heat sensitive shrink type tape. The conductive materials may be any of a variety of materials including copper wire, electrically conductive epoxy, such as EPO-TEK H37-MP silver filled epoxy, sold by Epoxy Technology, Inc., Billence, Mass. 01821-3972, or the like.

Figure 3:
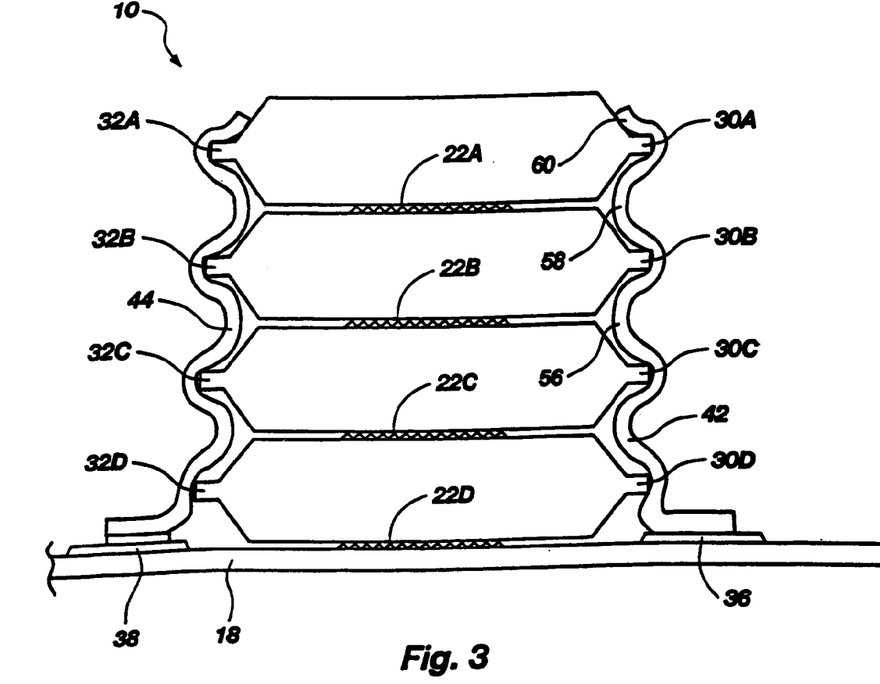
FIG. 3 is a front view of a stack of ICs according to one embodiment of the present invention.

Referring to FIG. 3, multi-conductor insulating assembly tape 42 includes conductors 50 (FIGS. 4A, B) having conductive sections that interface with terminals 30A, 30B, 30C, and 30D, and with multi-conductor port 36. The nature of these sections depends on the structure and shape of such terminals, the structure of multi-conductor port 36, and means of keeping multi-conductor insulating assembly tape 42 stationary with respect to the individual IC devices 14A–14D and multi-conductor port 36.

Figure 4A:
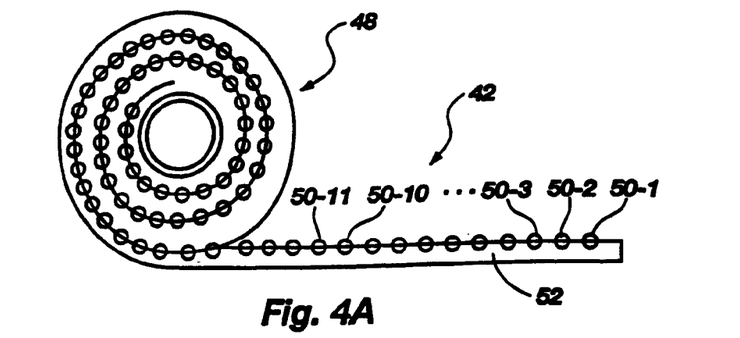
FIG. 4A is a side view of a spool of tape used in connection with FIG. 3.
Figure 4B:
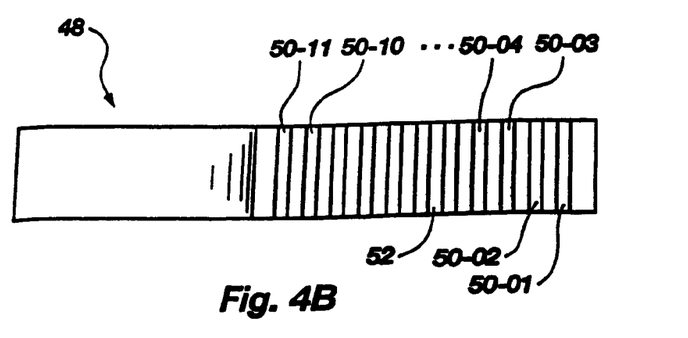
FIG. 4B is a top view of the tape of FIG. 4A.

For example, referring to FIGS. 4A and 4B, multi-conductor insulating assembly tape 42 is referred to as Y-axis tape, because it includes straight conductors 50 applied to a tape backing 52. Conductors 50 are aligned with a Y-axis with respect to an X-axis board 18. Multi-conductor insulating assembly tape 42 may be wrapped about a spool 48. As a portion of multi-conductor insulating assembly 42 is unwound from spool 48, it may be applied to the side of the stacked ICs 14, individually, 14A–14D as shown in FIG. 3. For ease in understanding, a portion of conductors 50 have been labeled 50-1, 50-2, 50-3, 50-4, . . . , and 50-11. Conductors 50 are spaced apart from one another so as to align with respective ones of terminals 30A, respective ones of terminals 30B, respective ones of terminals 30C, and respective ones of terminals 30D.

Tape backing 52 preferably includes a suitable adhesive thereon so as to adhere to the side of ICs 14, individually 14A–14D. For example, as shown in FIG. 3, a portion of backing 52 makes contact with a portion of each of the individual ICs 14A–14D at points 56, 58, and 60.

Figure 5:
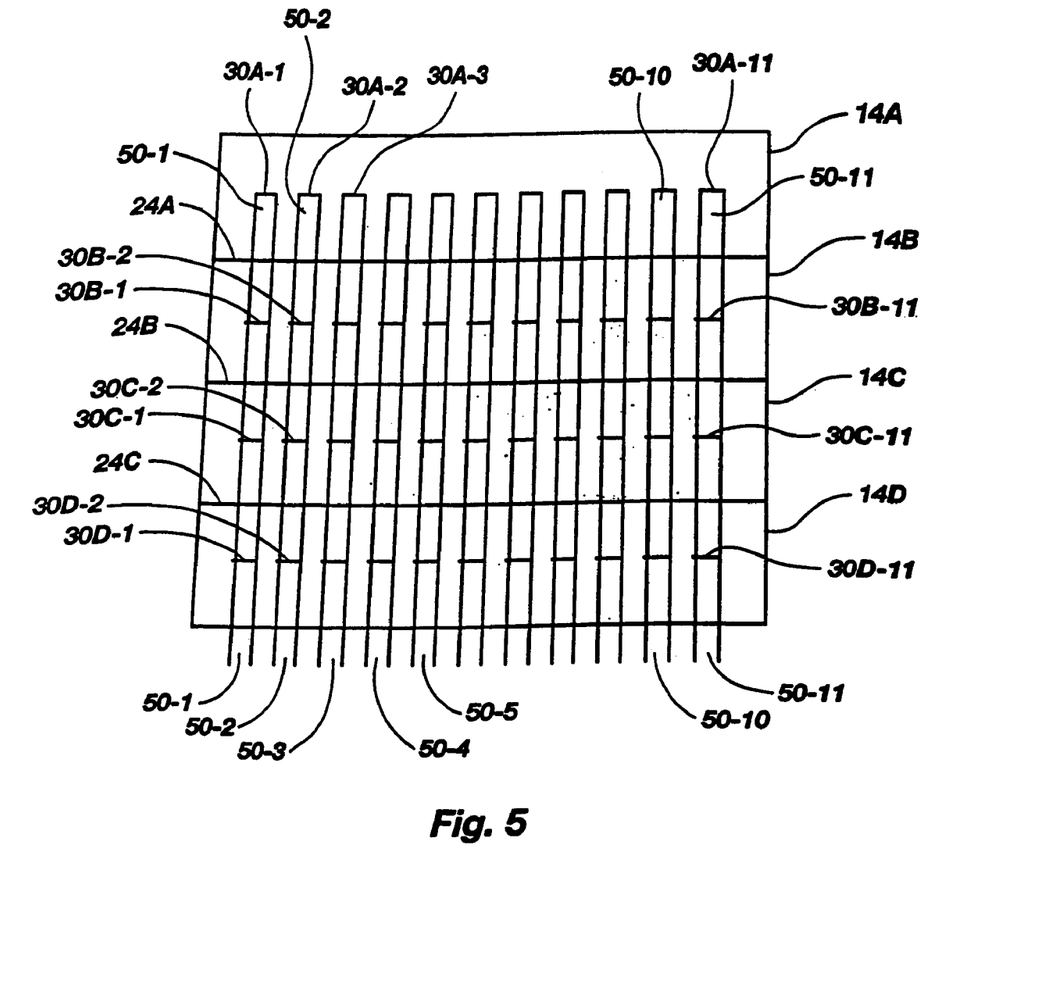
FIG. 5 is a side view of a portion of FIG. 1.

For example, FIG. 5 shows conductors 50-1, 50-2, 50-3, . . . , and 50-11 in alignment and making electrical contact with terminals 30A-1, 30A-2, 30A-3, . . . , and 30A-11; and in alignment and making electrical contact with terminals 30B-1, 30B-2, 30B-3, . . . , and 30B-11; in alignment and making electrical contact with terminals 30C-1, 30C-2, 30C-3, . . . , and 30C-11; and in alignment and making electrical contact with terminals 30D-1, 30D-2, 30D-3, . . . , and 30D-11. (To avoid unnecessary clutter in the drawing figure, not all terminals and conductors are labeled.)

Figure 6A:
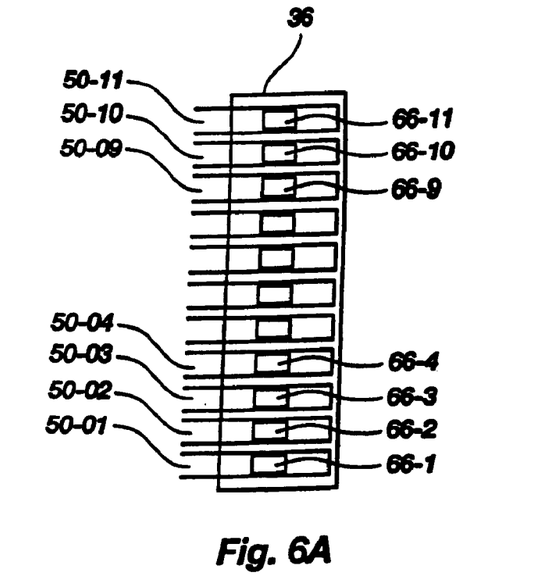
FIG. 6A is a top view of a multi-conductor port of FIG. 1.

FIG. 6A shows a top view of multi-conductor port 36, which includes conductive sections 66-1, 66-2, 66-3, . . . , and 66-11 spaced to align with conductors 50-1, 50-2, 50-3, . . . , and 50-11, respectively.

Multi-conductor insulating assembly tape 44 may be substantially the same as or differ somewhat from multi-conductor insulating assembly tape 42, and terminals 32A, 32B, 32C, and 32D may be substantially the same as or differ somewhat from terminals 30A, 30B, 30C, and 30D. Further, multi-conductor port 38 may be substantially the same as or differ somewhat from multi-conductor port 36.

Multi-conductor insulating assembly tape 42 may be cut after conductor 50-11, or it may just be applied to an adjacent assembly (similar to assembly 10) or wrapped around the back of IC device stack assembly 10 and applied to terminals 32A–32D.

In most situations, it is not desirable that every terminal on each IC device 14 receive exactly the same electrical signal. Accordingly, it is desirable that some terminals on IC devices 14A–14D receive different signals. Merely as an example, for each of the individual ICs 14A–14D, terminals 30A-11, 30B-11, 30C-11, and 30D-11 could be used as enabling terminals.

Figure 7:
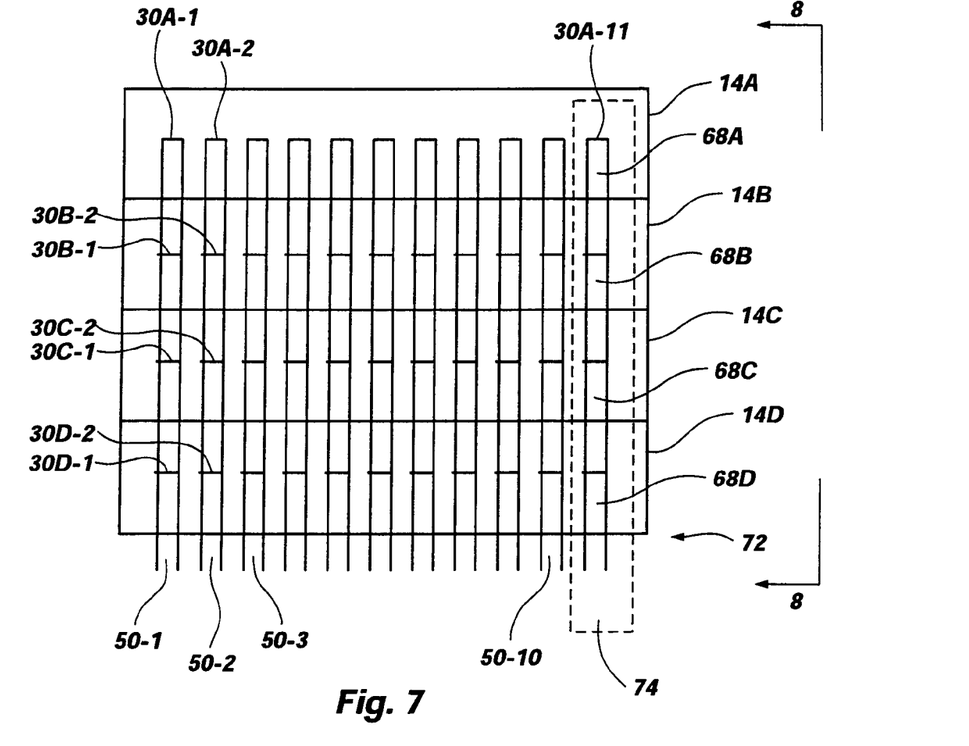
FIG. 7 is an alternative embodiment to that of FIG. 5.

Referring to FIG. 7, in such a case, merely as an example, multi-conductor insulating assembly tape 42 could be cut after conductor 50-10 and four separate conductors 68-A, 68-B, 68-C, and 68-D could be applied to terminals 30A-11, 30B-11, 30C-11, and 30D-11, respectively. Merely as an example, separate conductors 68-A, 68-B, 68-C, and 68-D could be joined in a tape 70 (FIG. 8) with an adhesive backing strip 74 thereon (the boarders of which are shown in dashed lines).

Figure 8:
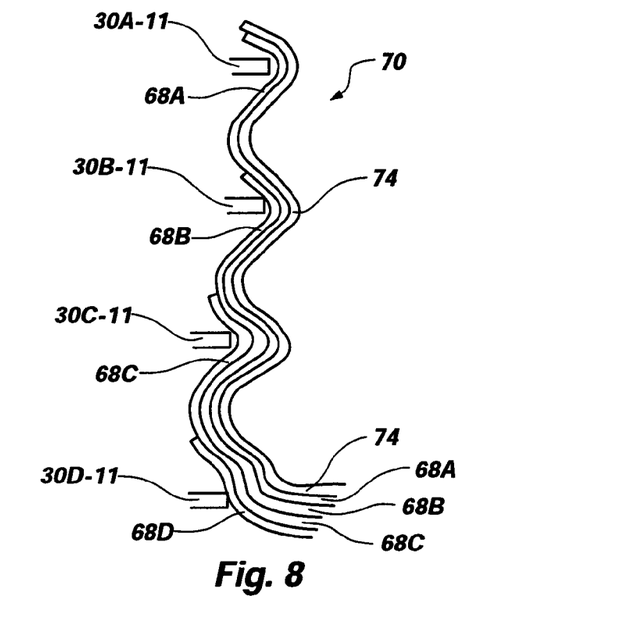
FIG. 8 is a cross-sectional view taken along line 8—8 of FIG. 7.

Merely as one example, as illustrated in FIG. 8 (which is a side view taken along lines 8—8 of FIG. 7), conductor 68D would be immediately adjacent to conductor 68C, which would be immediately adjacent to conductor 68B, which would be immediately adjacent to conductor 68A, for the portion of tape 70 below the respective terminal. There is an insulating coating of conductors 68B, 68C, and 68D, or other insulation means between conductors. (For purposes of illustration, the relative widths of conductors 68 and tape 70 are exaggerated.)

Figure 9:
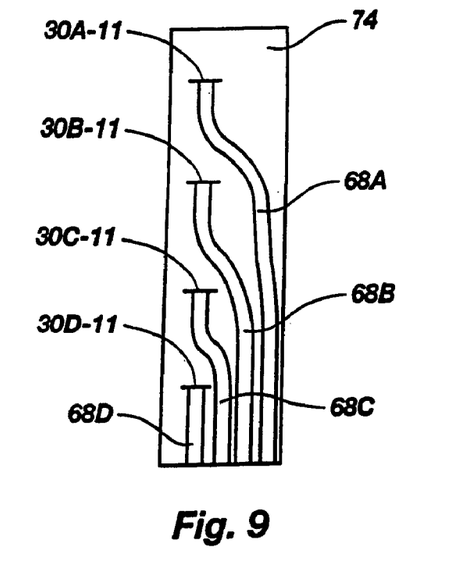
FIG. 9 is a front view of an alternative multi-conductor insulating assembly tape.
Figure 10:
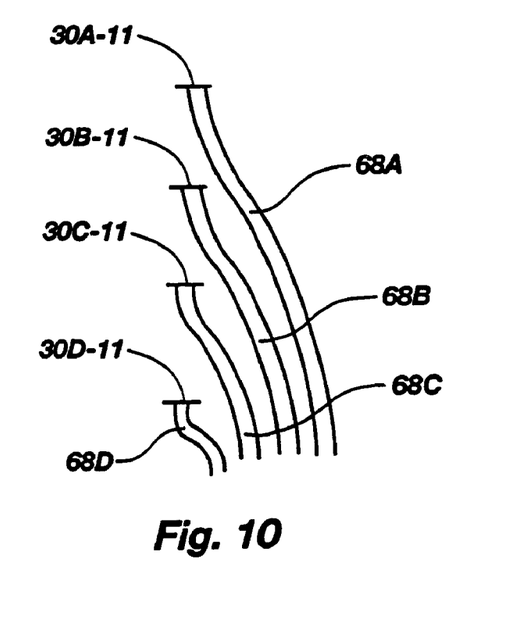
FIG. 10 is a front view of four separate conductors connected to four terminals.

As another example, as shown in FIG. 9, conductors 68A, 68B, 68C, and 68D could traverse different portions of adhesive backing 74 so as not to require overlap. As still another option, conductors 68A, 68B, 68C, and 68D could be completely separate, each having a different backing, or be surrounded by insulators. In the example of FIGS. 8, 9, or 10, the terminals that control chip enable could be on another portion of the ICs 14, such as on the front or back (whereas terminals 30 and 32 are on the side).

In some cases, more than one enable terminal would be required. Enablement could be controlled by addressing signals (e.g. the 2 or 3 most significant bits). Further, more than merely enable terminals could be different from each individual integrated circuit semiconductor device, such as IC 14A, as compared to another individual integrated semiconductor device, such as IC 14B. In such an example, various possible multi-conductor insulating assemblies may be used including those illustrated in FIGS. 8, 9, and 10. It is possible to have a single multi-conductor insulating assembly tape with different levels of conductors for different terminals. For example, when all corresponding terminals of ICs 14A–14D (e.g., terminals 30A-2, 30B-2, 30C-2, and 30D-2) are to receive the same signal, there need be only one level of conductor. By contrast, if the corresponding terminals of ICs 14A–14D (e.g., terminals 30A-2, 30B-2, 30C-2, and 30D-2) are each to receive different signals, then four levels of conductors may be used. FIG. 10 illustrates four separate conductors being used as an alternative to that of FIG. 9.

Figure 6B:
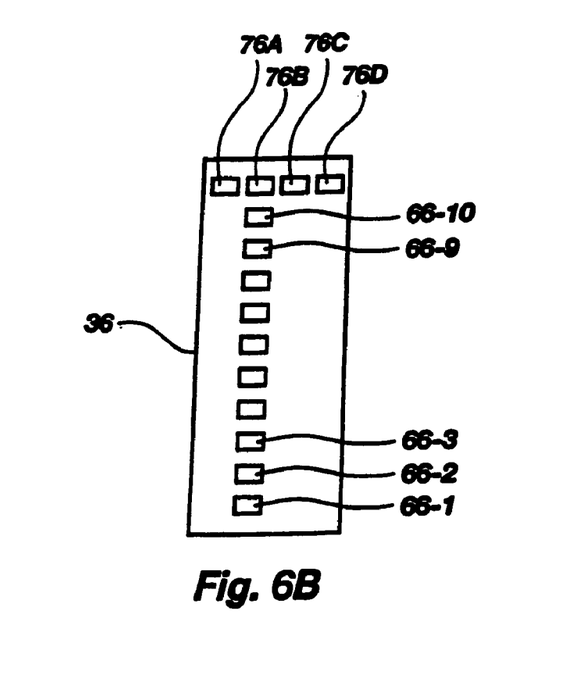
FIG. 6B is a top view of an alternative multi-conductor port.

FIG. 6B illustrates an alternative multi-conductor port 36 with four conductive sections 76A, 76B, 76C, and 76D which may be used in connection with the devices of FIGS. 8, 9, and 10.

Figure 11:
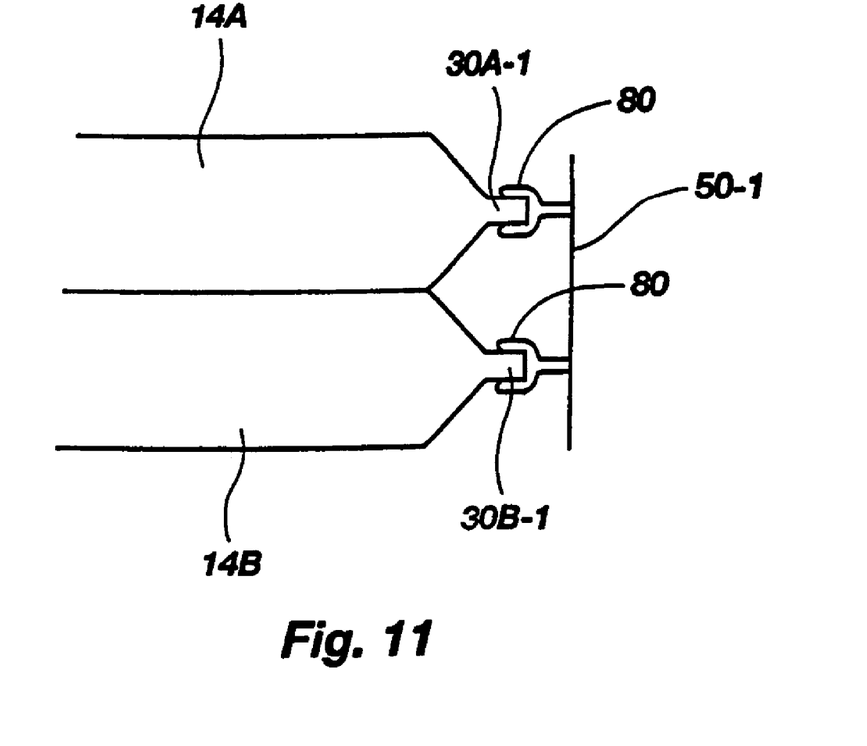
FIG. 11 is a front view of alternative means of connection between terminals and a multi-conductor insulating assembly tape.

Referring to FIG. 11, interface between terminals 30 and conductors 50 could be made with a male-female relationship. For example, female members 80 could be connected to conductors 50-1 through 50-11.

Figure 12:
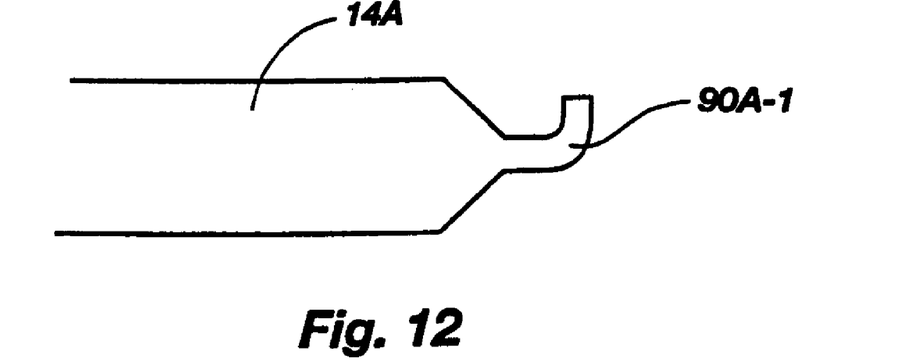
FIG. 12 is an alternative shape for a terminal.

Referring to FIG. 12, the terminals may have a variety of shapes. For example, by curving terminal 90A-1 (rather than terminal 30A-1), there is more surface to contact a conductor.

Figure 13A:
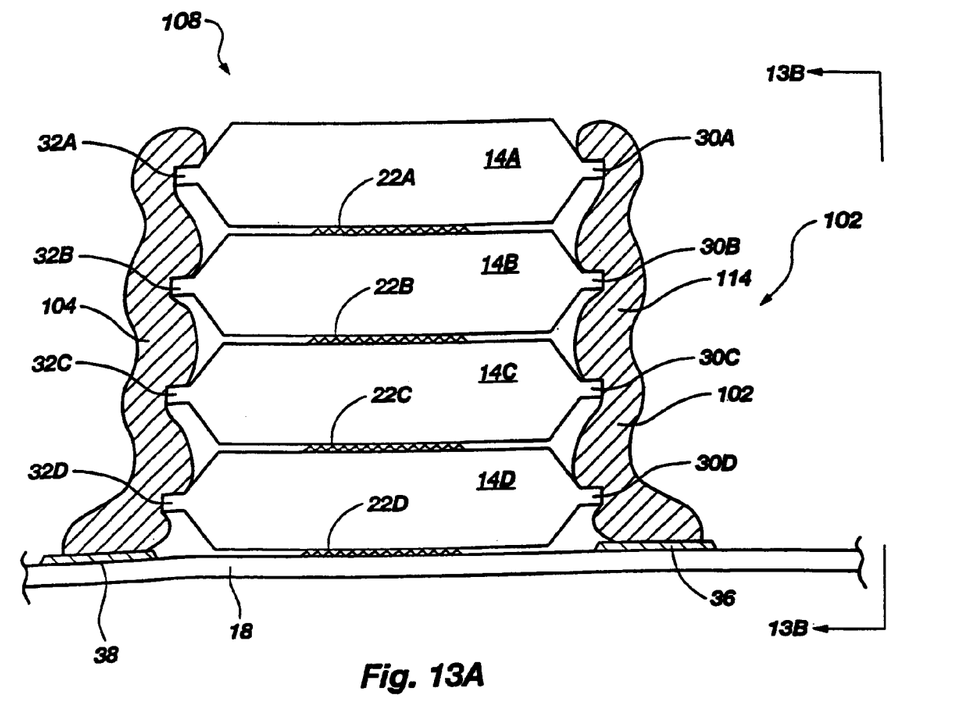
FIG. 13A is a front view of an alternative embodiment of the present invention of a stack of ICs using a conductive epoxy.

Referring to FIG. 13A, a multi-conductor epoxy assembly 102 and a multi-strand insulating epoxy assembly 104 are used in an IC device stack assembly 108, which may be the same as IC device stack assembly 10 except for replacing multi-conductor insulating tape 42 with multi-conductor and insulating epoxy assemblies 102 and 104.

Figure 13B:
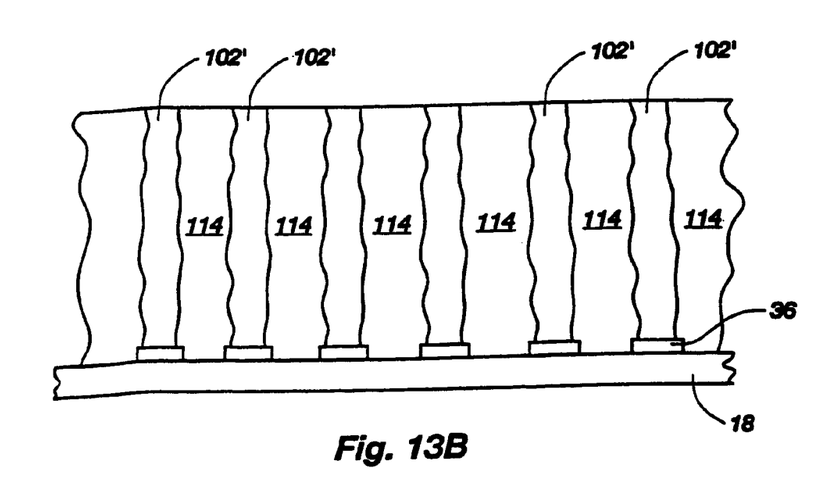
FIG. 13B is a side view along line B—B of FIG. 13A of the present invention.

Referring to drawing FIG. 13B, multi-conductor epoxy assembly 102 includes a plurality of conductors 102', each formed of suitable well known conductive epoxy material. Multi-strand insulating epoxy assembly 104 includes a plurality of strips of non-conductive epoxy material 114 located between the conductors 102'. Conductors 102', like conductors 50 may be injected into, bombarded on, or otherwise adhered to the non-conductive epoxy material 114 forming multi-strand insulating epoxy assembly 104. Multiple layers of conductors may also be applied to or into non-conductive epoxy material 114, such as is the case where corresponding terminals (e.g., terminals 30A-2, 30B-2, 30C-2, and 30D-2) are not to receive the same signal. The base epoxy material of multi-strand insulating epoxy assembly 104 may be substantially the same epoxy material as or differ somewhat from the base epoxy material of multi-conductor epoxy assembly 102.

Figure 14A:
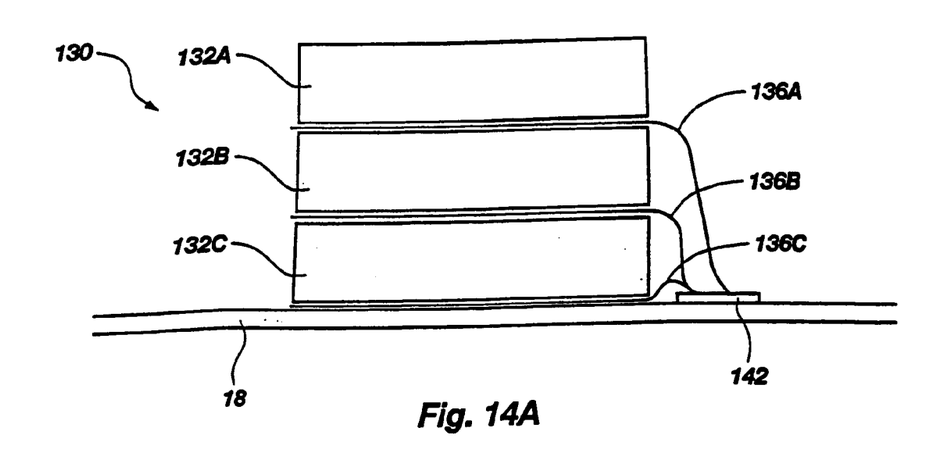
FIG. 14A is a front view of yet another embodiment of the present invention of a stack of ICs.
Figure 14B:
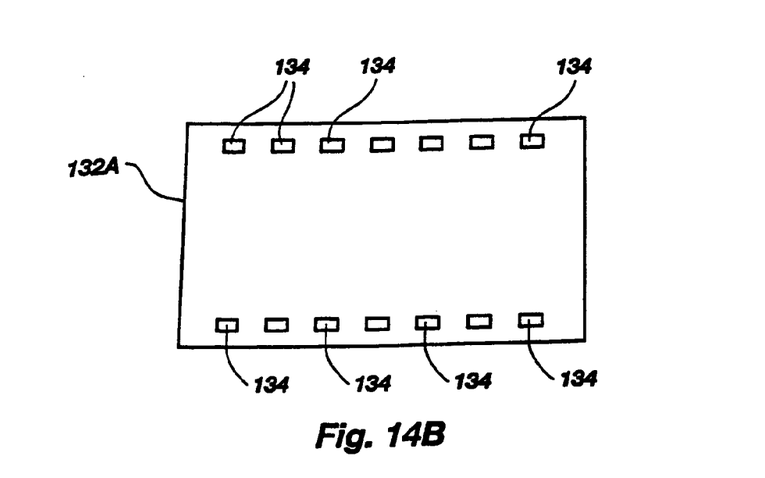
FIG. 14B is a bottom view of one of the ICs of FIG. 14A.

Referring to drawing FIG. 14A, a stack 130 of ICs that includes a stack of unpackaged ICs 132A, 132B, and 132C is illustrated. As shown in FIGS. 14A and 14B, the bottom of each of the ICs 132A, 132B, and 132C (of which device 132A is representative) includes bonding pads 134 thereon (which are a form of terminals). As shown in FIGS.

Figure 14C:
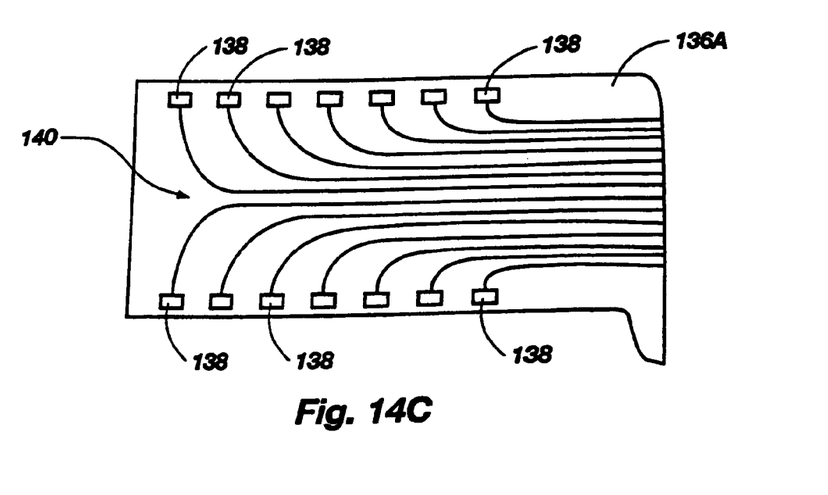
FIG. 14C is a top view of one of the multi-conductor insulating assembly tapes of FIG. 14A.

14A–14C, the top of multi-conductor insulating assembly tape 136A, 136B, and 136C (of which tape 136A is representative) includes corresponding contact pads 138 connected to conductors 140. Conductors 140 make electrical contact with a multi-conductor port 142 to interface with other external circuitry. As an alternative embodiment of the present invention to the embodiment shown in FIGS. 14A–14C, the bonding pads may be located on the top of each of the individual ICs. One integrated multi-conductor/insulating tape assembly may service IC devices on the top and bottom of the tape.

Figure 15:
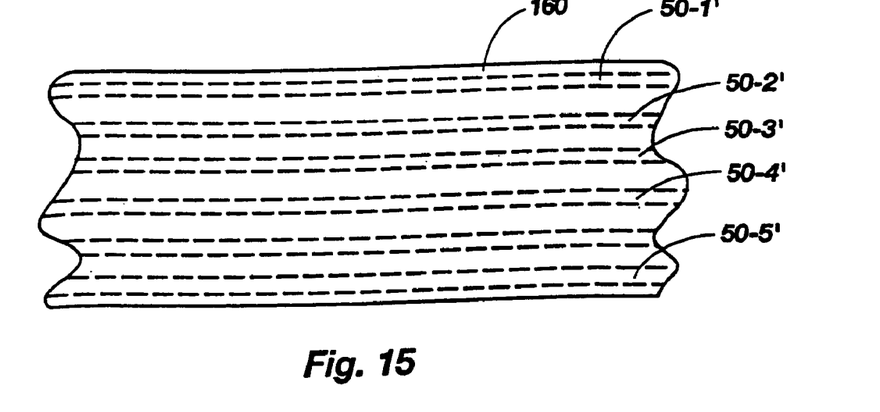
FIG. 15 is a side view of a multi-conductor extrusion prior to cutting a multi-conductor insulating assembly therefrom.

Referring to drawing FIG. 15, in yet another embodiment of the invention, as shown in a side view, a plurality of conductors 50-1', 50-2', 50-3', 50-4', 50-5', etc. may be formed in an extrusion of suitable insulating material 160. Any desired number of conductors 50-1', etc. may be formed in the extrusion in any desired matrix configuration. The conductors 50-1', etc. may be any desired shape, such as square, rectangular, etc. The matrix configuration may be of any desired shape, such as square, rectangular, etc.

Figure 16:
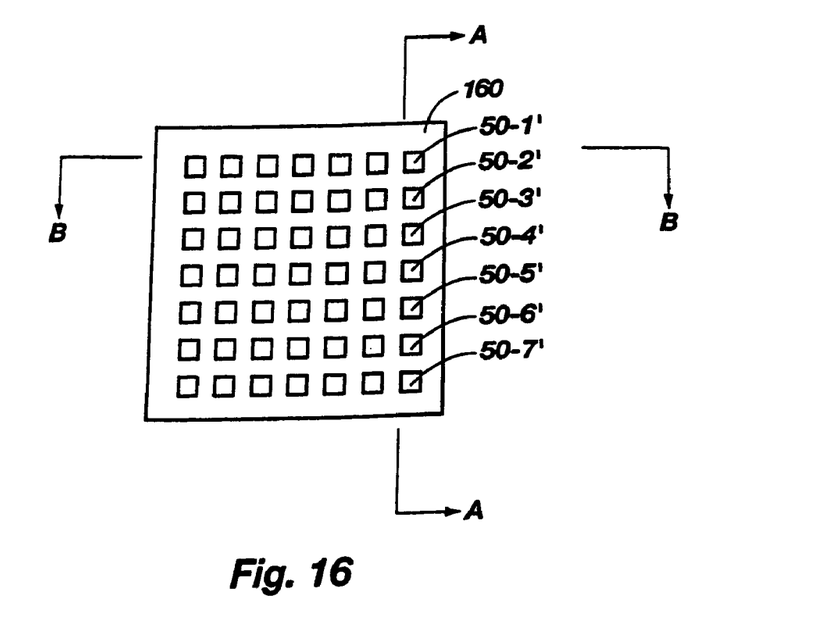
FIG. 16 is an end view of the multi-conductor extrusion of FIG. 15 prior to cutting a multi-conductor insulating assembly therefrom.

Referring to drawing FIG. 16, the plurality of conductors 50-1', etc. in the insulating material 160 as illustrated in drawing FIG. 15 is shown in an end view to illustrate the conductors 50-1', etc. formed within the insulating material 160 to form the desired matrix of conductors. The conductor matrix may be any desired shape having any desired number of conductors 50-1', etc. arranged therein. The conductor matrix may be cut along either lines A—A or B—B to expose a plurality of conductors 50-1', etc. to form a multi-conductor flexible insulating assembly for connection to a plurality of ICs 14. The insulation material 160 may be adhesively bonded or secured to portions of the ICs 14, as described previously herein, while the conductors 50-1', etc. may be secured in any suitable manner to the terminals 30A-1, etc. of the ICs 14, as described herein, to connect the multi-conductor flexible insulating assembly to the ICs 14. In this manner, the conductors 50-1', etc. may be conveniently extruded in a suitable insulation material matrix and cut to the desired number and length to form the desired multi-conductor flexible insulating assembly before connection to the terminals 30A-1, etc. of the ICs 14.

LOC, TAB, and flip-chip arrangements may be used in connection with the various embodiments of the present invention.

As used herein, the term "connect" and related words are used in an operational sense, and are not necessarily limited to a direct connection. For example, terminals 30 are connected to multi-conductor port 36, but indirectly through a conductor of a multi-conductor insulating assembly tape or epoxy.

Having thus described in detail preferred embodiments of the present invention, it is to be understood that the invention defined by the appended claims is not to be limited by particular details set forth in the above description, as many apparent variations thereof are possible without departing from the spirit or scope thereof.

What is claimed is:

1. A method for forming a stack of integrated circuit semiconductor devices on a board having a multi-port connector having at least one port comprising:
    attaching a first semiconductor device having a plurality of terminals thereon to the board;
    attaching a second semiconductor device having a plurality of terminals thereon to the first semiconductor device; and
    connecting a multi-conductor flexible assembly between at least one terminal of the plurality of terminals on the first semiconductor device and at least one terminal of the plurality of terminals of the second semiconductor device and the at least one port of the multi-port connector.

2. The method of claim 1, wherein the multi-conductor flexible assembly includes tape.

3. The method of claim 1, wherein the multi-conductor flexible assembly includes epoxy.

4. The method of claim 1, wherein the multi-conductor flexible assembly includes an extruded multi-conductor flexible assembly.

5. The method of claim 1, wherein the multi-conductor flexible assembly comprises an extrusion.

6. The method of claim 5, wherein the extrusion is cut to form the multi-conductor flexible assembly.

7. The method of claim 6, wherein at least one conductor is exposed during the cutting of the extrusion to form the multi-conductor flexible assembly.

8. The method of claim 6, wherein at least two conductors are exposed during the cutting of the extrusion to form the multi-conductor flexible assembly.

9. The method of claim 1, wherein the multi-conductor flexible assembly includes a plurality of conductors separated by insulating material.

10. A method of forming a semiconductor device assembly on a support surface having a first multi-conductor assembly on the support surface, the first multi-conductor assembly having at least one contact pad, comprising:
    providing a first semiconductor device having bond pads thereon;
    providing a second semiconductor device having bond pads thereon;
    positioning the first semiconductor device on the first multi-conductor assembly having at least one bond pad of the first semiconductor device contacting the at least one contact pad of the first multi-conductor assembly;
    positioning a second multi-conductor flexible assembly on the first semiconductor device, the second multi-conductor flexible assembly including at least one contact pad; and
    positioning a second semiconductor device having at least one bond pad thereof contacting the at least one contact pad of the second multi-conductor flexible assembly.

11. The method of claim 10, wherein the at least one contact pad of the first multi-conductor assembly and the at least one contact pad of the second multi-conductor flexible assembly are each connected to conductors which are, in turn, connected to a multi-conductor port supported by the support surface.

12. A method for forming a semiconductor assembly on a board having a multi-conductor port thereon comprising:
    providing a first semiconductor device having a plurality of bond pads;
    providing a first multi-conductor assembly having a plurality of contact pads thereon;
    providing a second semiconductor device having a plurality of bond pads thereon;
    providing a second multi-conductor assembly having a plurality of contact pads thereon;
    attaching the first semiconductor device to the board;
    positioning the first multi-conductor assembly on the first semiconductor device having at least one contact pad of the plurality of contact pads of the first multi-conductor assembly contacting at least one bond pad of the plurality of bond pads of the first semiconductor device;

positioning the second semiconductor device on the first multi-conductor assembly; and positioning the second multi-conductor assembly on the second semiconductor device having at least one contact pad of the plurality of contact pads of the second multi-conductor assembly contacting at least one bond pad of the plurality of bond pads of the second semiconductor device.

13. The method of claim 12, wherein the at least one contact pad of the plurality of contact pads of the first multi-conductor assembly and the at least one contact pad of the plurality of contact pads of the second multi-conductor assembly are connected to conductors which are, in turn, connected to the multi-conductor port on the board.

\* \* \* \* \*